(12) United States Patent
Mikani et al.

(10) Patent No.: US 8,654,487 B2
(45) Date of Patent: Feb. 18, 2014

(54) METHODS, SYSTEMS, AND APPARATUS AND FOR DETECTING PARALLEL ELECTRICAL ARC FAULTS

(75) Inventors: Vaske Mikani, Senoia, GA (US); Amit Nayak, Atlanta, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 458 days.

(21) Appl. No.: 13/045,751

(22) Filed: Mar. 11, 2011

(65) Prior Publication Data

US 2012/0229939 A1    Sep. 13, 2012

(51) Int. Cl.
*H02H 3/00* (2006.01)
(52) U.S. Cl.
USPC .................................................. 361/42
(58) Field of Classification Search
USPC ....................................... 361/55, 42
See application file for complete search history.

(56) References Cited

U.S. PATENT DOCUMENTS

| | | | |
|---|---|---|---|
| 6,798,628 B1 | 9/2004 | Macbeth | |
| 7,268,989 B2 * | 9/2007 | Parker et al. | 361/42 |
| 7,492,163 B2 * | 2/2009 | Restrepo et al. | 324/536 |
| 7,864,492 B2 * | 1/2011 | Restrepo et al. | 361/42 |
| 2006/0227469 A1 | 10/2006 | Elms et al. | |
| 2008/0204949 A1 | 8/2008 | Engel et al. | |

FOREIGN PATENT DOCUMENTS

EP    2040348 A2    3/2009

OTHER PUBLICATIONS

PCT Invitation to Pay Additional Fees mailed Jul. 13, 2012 corresponding to PCT International Application No. PCT/US2012/024403 filed Feb. 9, 2012 (6 pages).

\* cited by examiner

*Primary Examiner* — Stephen W Jackson

(57) ABSTRACT

In one aspect, a method for detecting arc faults with a dynamically-changeable slope threshold is disclosed. The method may include monitoring a current waveform to determine a peak amplitude of a half cycle and a slope at a zero crossing of a half cycle. An arc fault counter may be incremented if the maximum amplitude of the half cycle and the slope at a zero crossing are greater than a preset magnitude threshold level and the dynamically-changeable slope threshold, respectively. In another aspect, a decay of the amplitude of a predetermined number of half cycles of the current waveform is measured and an arc counter is not incremented, even if the conditions would otherwise indicate an arc counter increment, when the decay is above a decay threshold for greater than a predetermined number of half cycles. An arc fault detection apparatus adapted to carry out the methods, and systems including the arc fault detection apparatus are disclosed, as are various other aspects.

20 Claims, 12 Drawing Sheets

TRIP CIRCUIT

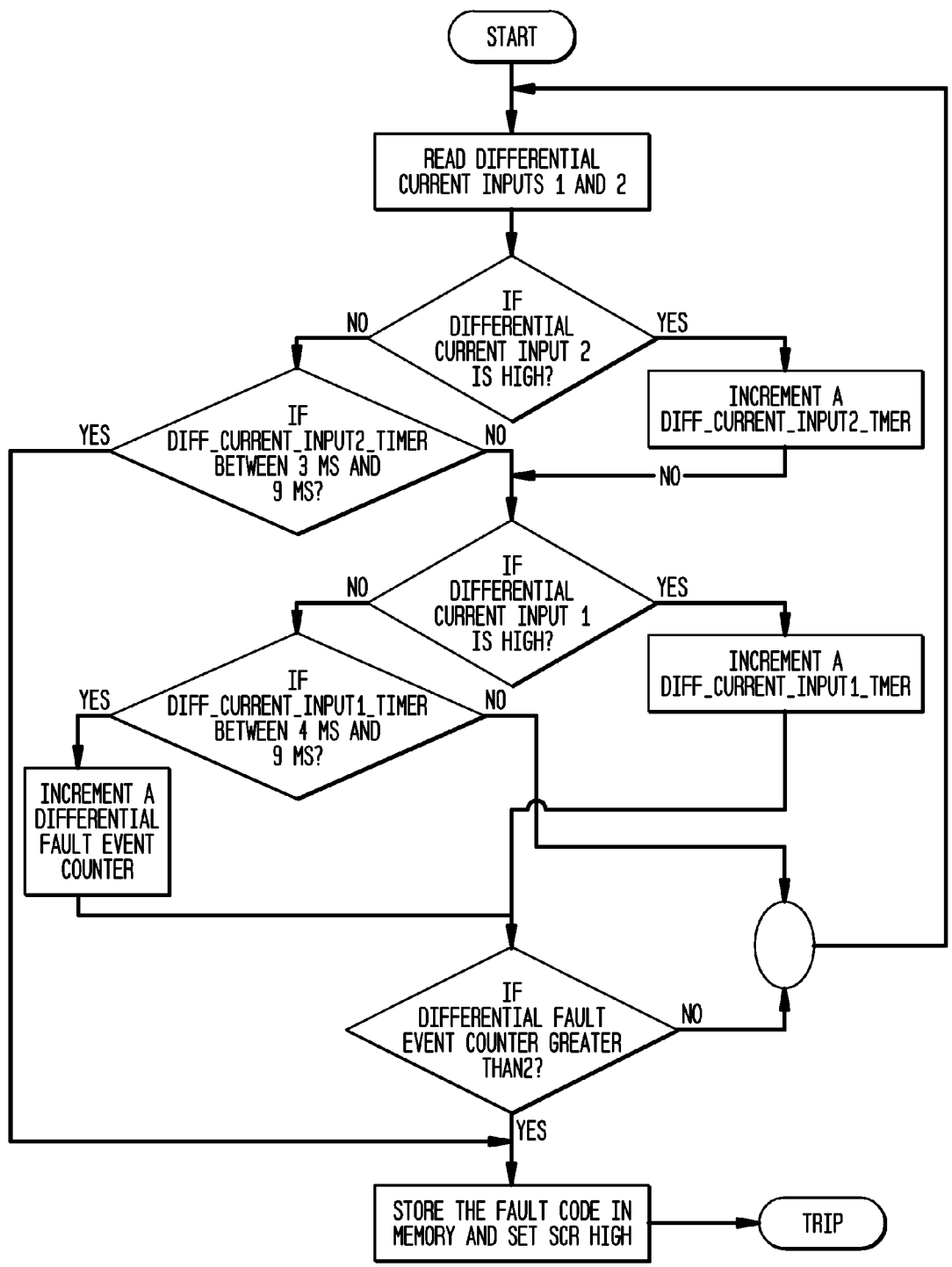

METHODS, SYSTEMS, AND APPARATUS AND FOR DETECTING PARALLEL ELECTRICAL ARC FAULTS

FIELD OF THE INVENTION

The present disclosure relates generally to arc fault detection in electrical circuits and, more particularly, to methods, systems, and apparatus for detecting and mitigating parallel arc faults in electrical systems.

BACKGROUND

Electrical systems for a number of known reasons may experience unwanted electrical arc faults. One type of arc fault is a parallel arc fault, which can occur as a short circuit or a ground fault. A short circuit arc decreases the dielectric strength of insulation separating the conductors, allowing a high-impedance, low-current arc fault to develop that may carbonize the conductor's insulation, thereby further decreasing the dielectric of the insulation separating the conductors. The result may be increased current and arcing in the circuit. The current flow in a short circuit, parallel arc fault may be limited by the system impedance and the impedance of the arc fault itself.

Current methods of detecting such faults examine the peak current magnitude of a half cycle and the current slope at the zero crossing of the half cycle of the waveform. If the slope and amplitude are both above a certain fixed threshold magnitudes, then a parallel arc fault is indicated and the breaker (e.g., an AFCI) may be tripped. However, such threshold levels need to be set relatively high so that certain circuit conditions, which mimic parallel arcs, such as an in rush condition at startup of a motor connected as a load on the circuit protected by the AFCI, do not trip the circuit breaker.

For example, when the current is non-sinusoidal, such as exhibited by nonlinear loads having a high crest factor, such as exhibited by vacuum cleaners, drills, and other household items, the current magnitude at startup might be high enough in an in rush condition to exceed the amplitude threshold. Similarly, such high crest factor loads have a generally higher slope than sinusoids at the same magnitude. Accordingly, such in rush conditions may also exceed the fixed slope thresholds.

Therefore, a need exists for a circuit breaker and detection method that may discriminate between actual arc faults and conditions mimicking an arc fault, such as in rush conditions.

SUMMARY

According to first aspect, a method of electrical arc fault detection is provided. The method includes measuring a maximum current amplitude of a first half cycle of a detected current waveform; detecting a current slope at a zero arc crossing of the first half cycle or a next half cycle; comparing the maximum current amplitude to an amplitude threshold; and comparing the current slope to a dynamic slope threshold. The dynamic slope threshold may be calculated as a function of maximum current amplitude of the first half cycle.

In accordance with another method aspect the present invention, a method of electrical arc fault detection is provided. The method includes measuring a first current amplitude of a first half cycle of a detected current waveform; measuring a current amplitude of the detected current waveform for a predetermined number of half cycles after the first half cycle; comparing the current amplitudes to determine a decay; and not incrementing an arc counter, even if a increment is otherwise indicated, when the decay is greater than a threshold decay for greater than a predetermined number of half cycles.

In accordance with another aspect the present invention, an electrical fault interrupting apparatus is provided. The electrical fault interrupting apparatus includes an electrical shunt coupled to a load neutral; a shunt circuit coupled to the electrical shunt; and a microprocessor coupled to the shunt circuit, the shunt circuit adapted to generate and provide a current waveform to the microcontroller, the microprocessor adapted to calculate a dynamic slope threshold based upon a current amplitude of a half cycle of the current waveform, and compare an instantaneous current slope obtained from the waveform at the zero crossing to the dynamic slope threshold.

In accordance with another aspect the present invention, an electrically protected system is provided. The electrically protected system includes an electrical fault interrupting apparatus having an electrical shunt coupled to a load neutral; a shunt circuit coupled to the electrical shunt; and a microprocessor coupled to the shunt circuit, the shunt circuit adapted to generate an current amplitude signal to the microcontroller, the microprocessor adapted to calculate a dynamic slope threshold based upon the current amplitude signal, and compare an instantaneous current signal at a zero crossing from the shunt circuit to the dynamic slope threshold; and a load coupled to the electrical fault interrupting apparatus.

Still other aspects, features, and advantages of the present invention may be readily apparent from the following detailed description by illustrating a number of exemplary embodiments and implementations, including the best mode contemplated for carrying out the present invention. The present invention may also be capable of other and different embodiments, and its several details may be modified in various respects, all without departing from the spirit and scope of the present invention. Accordingly, the drawings and descriptions are to be regarded as illustrative in nature, and not as restrictive. The drawings are not necessarily drawn to scale. The invention is to cover all modifications, equivalents, and alternatives falling within the spirit and scope of the invention.

BRIEF DESCRIPTION OF DRAWINGS

FIG. 6 illustrates a flowchart depicting an exemplary differential fault detecting method according to another aspect of the invention.

DETAILED DESCRIPTION

Figure 1:
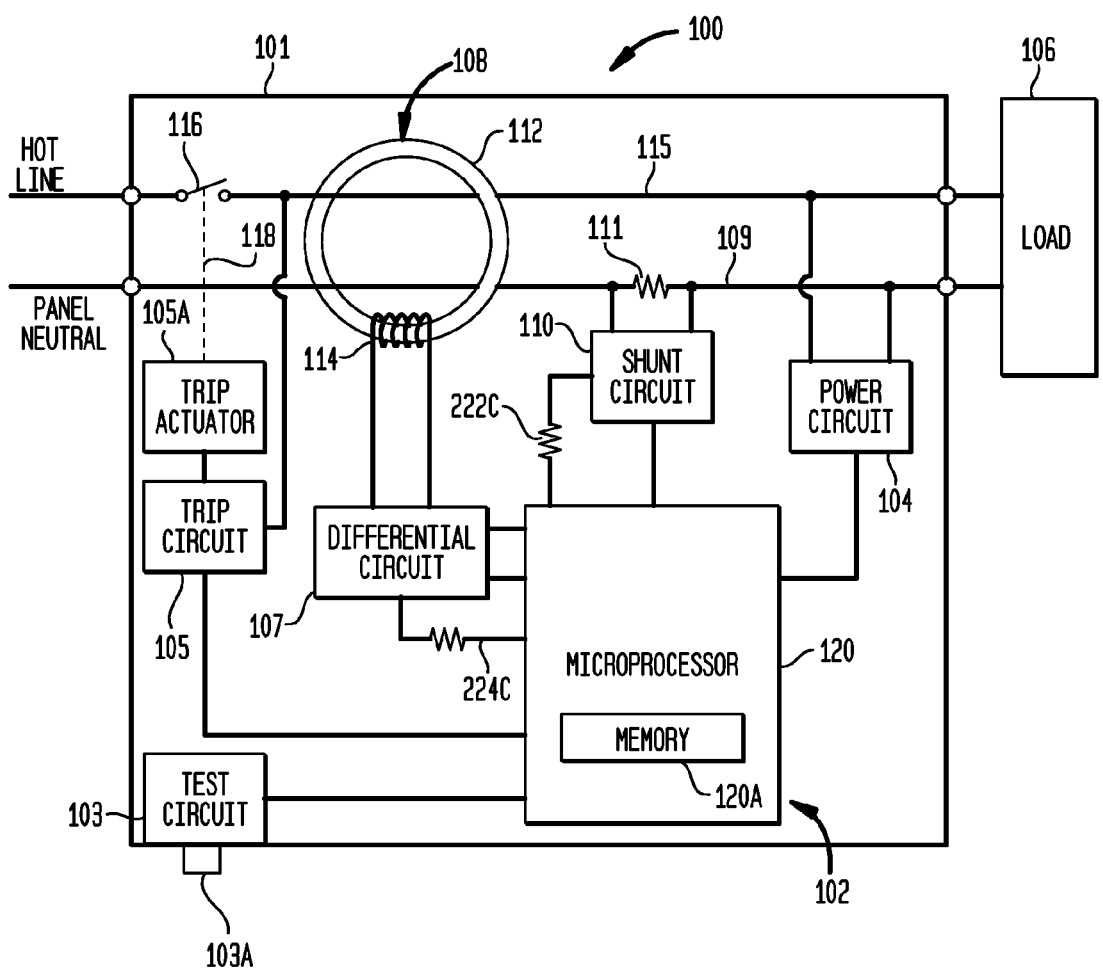
FIG. 1 illustrates a block diagram of an embodiment of a protected electrical system including an arc fault interruption apparatus according to an aspect of the present invention.

Reference will now be made in detail to the exemplary embodiments of this disclosure, examples of which are illustrated in the accompanying drawings. Wherever possible, the same reference numbers will be used throughout the drawings to refer to the same or like parts.

The aforementioned problems associated with prior art arc fault detection apparatus and methods are overcome by the present invention. In particular, in a first aspect, a dynamic slope threshold is utilized to determine the existence of an arc fault, as compared to the static slope threshold used in the prior art. The dynamic slope threshold may be set as a function of maximum detected amplitude of a current half cycle or previous half cycle of a detected current waveform, for example. A trip signal may be provided based upon: 1) the peak current amplitude of a first half cycle of the detected current waveform exceeding an amplitude threshold, and 2) a detected current slope at a zero arc crossing of the first half cycle or next half cycle exceeding the dynamic slope threshold.

In another aspect, to avoid unwanted breaker tripping on current waveforms that mimic arc fault events (e.g., in rush conditions), a magnitude of the detected current amplitude over a predetermined number of consecutive half cycles (e.g., three consecutive half cycles or more) of the detected current waveform may be monitored. A level of decay of the maximum (peak) amplitude between the predetermined number of half cycles (e.g., three consecutive half cycles or more) may be determined. This decay may be compared against predetermined decay criteria (e.g., a per cycle decay threshold). If the decay is greater than the threshold for greater than a predetermined number of consecutive cycles, then a counter is not incremented, even if an increment would be otherwise indicated (such as by both the afore-mentioned maximum amplitude threshold and slope threshold at the zero crossing being exceeded). In this manner, a current waveform that otherwise mimics an arc fault event, but that exhibits waveform amplitude decay meeting certain criteria, does not initiate a tripping event. After a preset number of cycles (e.g., the predetermined number plus one), if no further arc fault indications are present, the arc fault counter may be reset to zero.

In another aspect, the invention is an electrical fault interruption apparatus. The electrical fault interruption apparatus includes an electrical shunt coupled to a shunt circuit (a zero and span circuit) and a microprocessor coupled to the shunt circuit and adapted to receive signals therefrom indicative of the current waveform flowing in the electrical shunt. The microprocessor is operable to calculate a dynamic slope threshold and compare the instantaneous current slope at the zero crossing of a half cycle to the dynamic slope threshold. In some embodiments, when the sensed current slope at the zero crossing of the half cycle (current or next half cycle) of the waveform exceeds the dynamic slope threshold, and a peak amplitude for a half cycle of the current waveform exceeds an amplitude threshold for the half cycle, then an arc counter may be incremented. Upon exceeding an arc count threshold, a trip signal may be generated. Accordingly, a trip signal may be provided to a trip circuit that causes actuation of a trip actuator responsive to a trip signal for opening the hot line.

In another aspect, the invention is an electrical fault interruption apparatus. The electrical fault interruption apparatus includes a electrical shunt coupled to a shunt circuit (e.g., a zero and span circuit) and a microprocessor coupled to the shunt circuit and adapted to receive signals from the shunt circuit indicative of the current waveform passing through the electrical shunt. The microprocessor is operable to calculate the maximum current amplitude for a predetermined number of half cycles of the current waveform, and determine an extent of decay of the current waveform over time (e.g., consecutive cycle-to-cycle decay). If the tripping criteria is met (e.g., zero crossing slope above the slope threshold and peak amplitude of a half cycle above a threshold), and decay of the current waveform for greater than a predetermined number of consecutive half cycles is above a predefined threshold, then an arc fault counter may be zeroed. For example, if three consecutive half cycles indicate decay, then the arc fault counter may be zeroed on the fourth half cycle, as this may indicate a false trip event (e.g., an in rush condition). However, if the decay threshold is not exceeded, then the arc fault counter may be incremented provided the established tripping criteria are met. The arc fault counter may be incremented for each additional half cycle where the decay is below the decay threshold and where the trip criteria are met. Upon exceeding an arc count threshold, a trip signal may be generated and sent to a trip circuit to actuate an actuator and thereby open the circuit breaker.

These and other embodiments of apparatus and methods will be explained further with reference to FIGS. 1-6 herein.

FIG. 1 illustrates a diagram of an exemplary electrical arc fault circuit interrupting (AFCI) apparatus 100 according to an aspect of the invention. This apparatus 100 may be adapted for use in any residential and/or commercial power system environment and may be configured to detect arc faults, such as line-fault (i.e., parallel-type arcing between lines) that may be present on an electrical power distribution circuit. Apparatus 100 may also be configured to detect differential current faults starting from about 50 mA occurring on or otherwise associated with the electrical power distribution circuit.

As illustrated in FIG. 1, the electrical fault interrupting apparatus 100 may include a housing 101 including fault detection circuitry 102, and a trip circuit 105 adapted to trip the electrical fault interrupting apparatus 100 responsive to a trip signal from the fault detection circuitry 102. A power circuit 104 may be provided and is adapted to provide power to the various system components (e.g., the fault detection circuitry 102 and trip actuator 105A). The electrical fault interrupting apparatus 100 may also include a test circuit 103 including a button or switch 103A for manually initiating a self-test process, and may include a display (not shown) for outputting status, health, and/or fault information associated with the electrical fault interrupting apparatus 100. It is contemplated that the electrical fault interrupting apparatus 100 may include additional, different, and/or fewer elements than those listed above. For example, electrical fault interrupting apparatus 100 may include an interface (not shown) adapted to communicatively couple to an electronic device (e.g., a computer or diagnostic tool for downloading fault information) to or from the fault detection circuit 102 of the electrical fault interrupting apparatus 100. This interface may include any type of electronic interface adapted for transferring information from one electronic system to another such as, for example, a series bus, a parallel bus, a USB or Firewire interface, or any other type of suitable communication interface. This interface may facilitate the upload and download of information (e.g., fault event data, self-test data, software and/or firmware upgrades, software routines, etc.) to and from the electrical fault interrupting apparatus 100.

As illustrated in FIG. 1, the electrical fault interrupting apparatus 100 may be electrically coupled to one or more electrical load circuits including one or more electrical loads 106. The electrical fault interrupting apparatus 100 of the invention is configured and adapted to monitor electrical signals associated with the one or more electrical load circuits. In particular, the monitoring is accomplished, as will become apparent, by at least a shunt circuit 110 coupled to an electrical shunt 111 in the neutral line 109. Electrical connectors may coupled the shunt circuit 110 to either side of the electrical shunt 111 that is connected in series in the neutral line 109.

A differential circuit 107 electrically coupled to a sensor 108 may also be provided. The sensor 108 may be a differential transformer including a magnetic core 112 in the form of a ring of conductive material (e.g., copper), and a coil 114 wrapped about the core 114. Such differential transformers are well known and will not be further explained herein. In the depicted embodiment, both the neutral line 109 and the hot line 115 pass through the core 112 of the sensor 108.

As is shown in FIG. 6, an exemplary method for determine a differential fault is provided. The differential circuit 107 functions to provide the microprocessor 120 with two PWM signals. Both the PWM signals correspond to the input signal greater than fixed thresholds determined for 50 mA and 250 mA current, respectively, for example. Other threshold values may be used. Once the PWM signal is received by the microprocessor 120, the pulse width of the signal is calculated and stored. For example, if the pulse width of the PWM signal is between limits (e.g., greater than 3 ms and less than 9 ms) for the 50 mA comparator, a differential fault counter may be incremented. If the differential fault counter is greater than a pre-determined threshold, the microprocessor 120 sends a trip signal to the trip circuit 105. Electrical connectors from either end of the coil 114 are electrically coupled to the differential circuit 107 of the fault detection circuitry 102.

The fault detection circuitry 102 may include one or more circuits and/or subsystems for monitoring electrical signals passing through the electrical fault interrupting apparatus 100, identifying (detecting) the existence of arc fault conditions associated with the electrical signals, and sending a trip signal to the trip circuit 105 to cause a switch 116 in the hot line 115 to open thereby mitigating the effects of the detected arc fault conditions. The dotted line 118 coupled between the trip actuator 105A and the switch 116 is indicative of a mechanical linkage or assembly that, upon actuation of a trip actuator 105A, will cause the opening of the switch 116 thereby interrupting electrical power to the load 106. Additionally, the fault detection circuitry 102 may perform one or more self-monitoring functions, such as a self test utilizing one or more test circuits 103 to ensure appropriate operation of the electrical fault interrupting apparatus 100.

The electrical fault interrupting apparatus 100 may include one or more electrical components or circuits electrically coupled to a microprocessor 120. The microprocessor 120 may be a ATtiny461 available from Atmel, for example. Other types of microprocessors 120 may be used. Any suitable processor capable of processing incoming current signals and rendering signals to the trip circuit 105 may be used. It is contemplated that additional, fewer, and/or different components may be associated with the electrical fault interrupting apparatus 100 and arc fault detection circuitry 102.

Figure 2A:
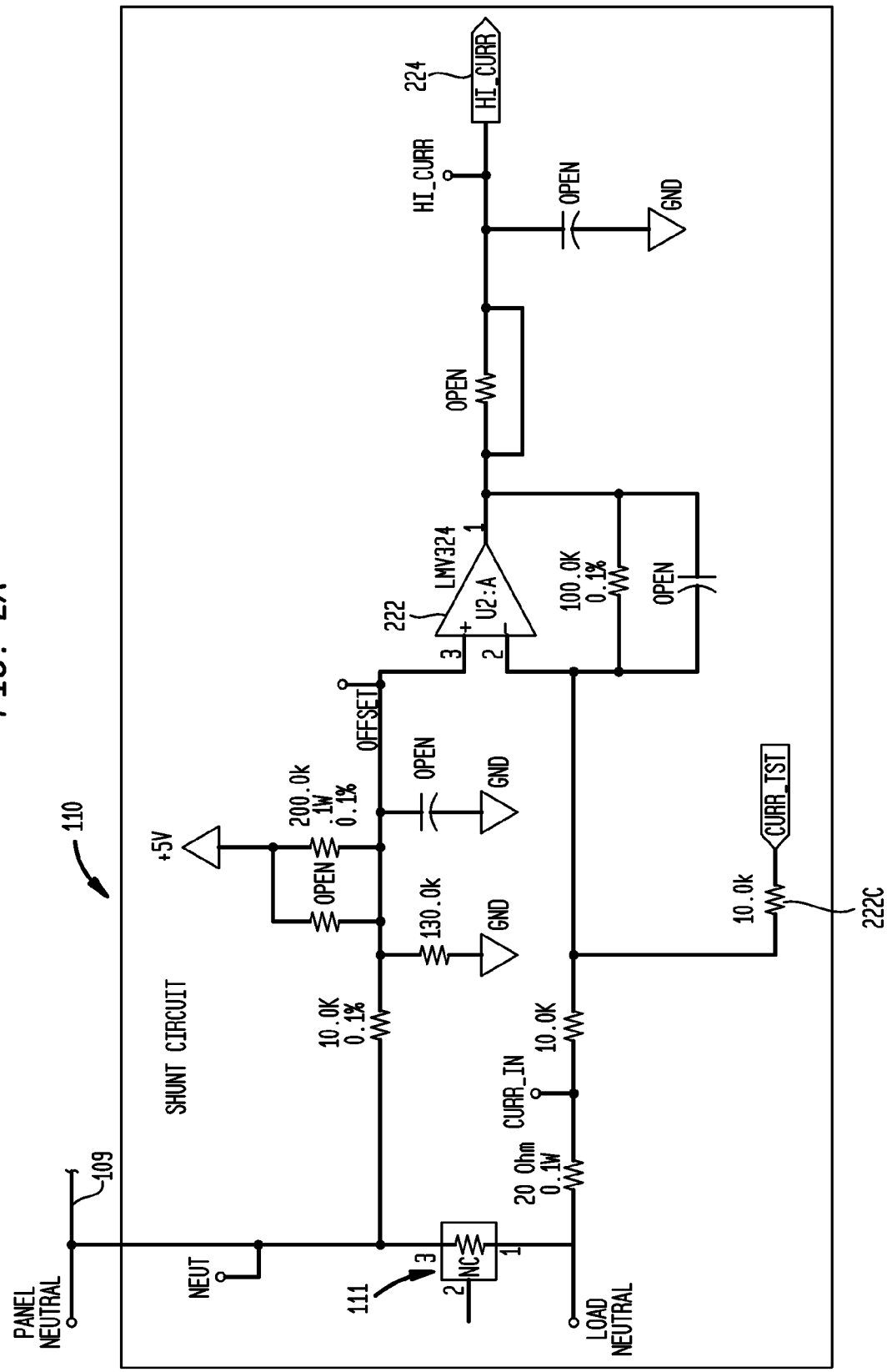
FIG. 2A illustrates an embodiment of exemplary shunt circuit of an arc fault interruption apparatus according to an aspect of the present invention.
Figure 2B:
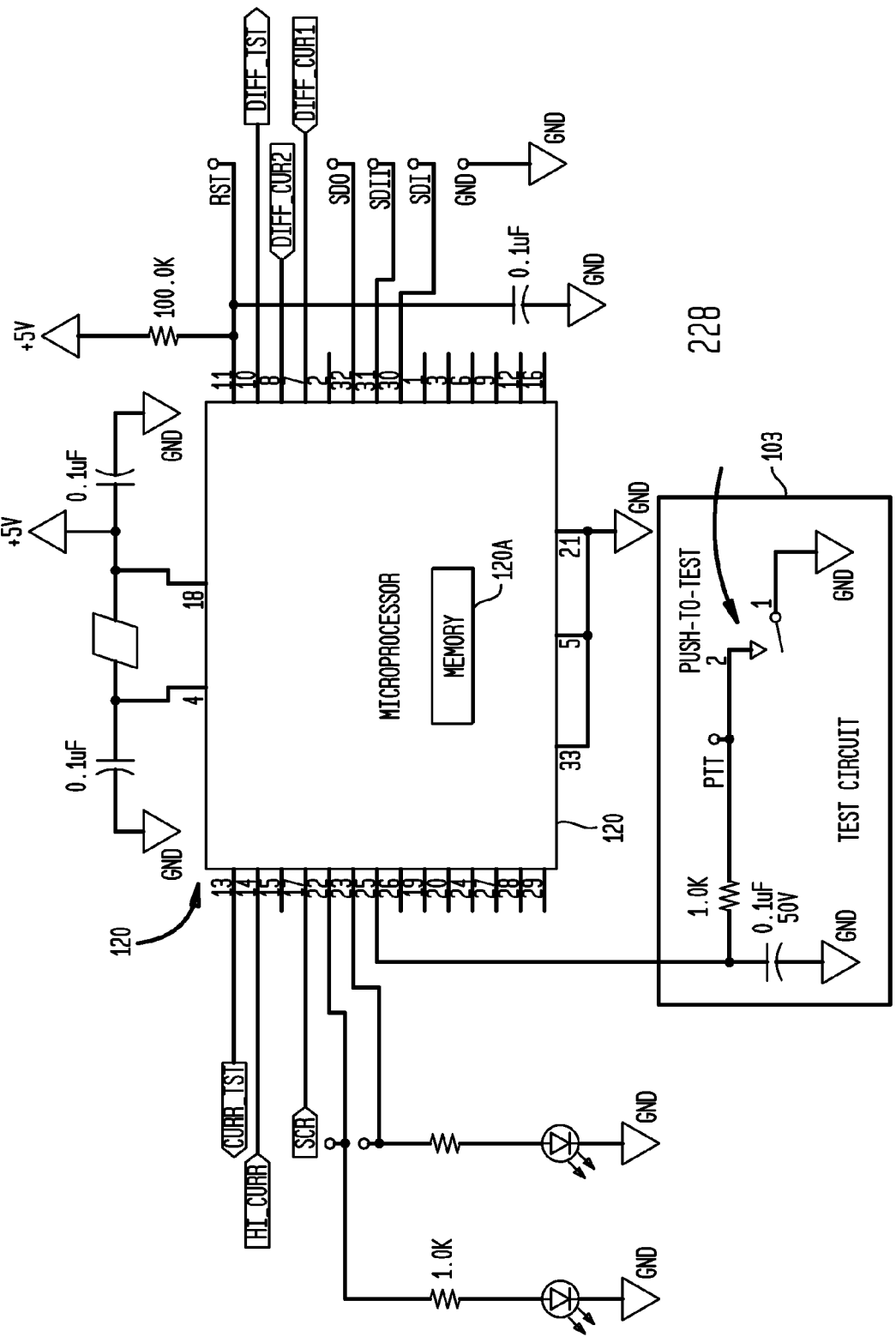
FIG. 2B illustrates an embodiment of exemplary microprocessor of an arc fault interruption apparatus according to an aspect of the present invention.

In more detail, the arc fault detection circuitry 102 may include one or more components for performing operations associated with electrical fault interrupting. For example, arc fault detection circuitry 102 may include components or circuits for providing or conditioning the signals for analysis by the microprocessor 120. For example, arc fault detection circuitry 102 may include a shunt circuit 110 including an amplifier 222 as best shown in FIG. 2A, that may be electrically connected between the neutral line 109 and the microprocessor 120. The shunt circuit 110 is a zero and span circuit and functions to process the current passing through the shunt 111 and provide an output signal at output node 224 that is representative of instantaneous current flowing through the shunt 111. A differential voltage across the inputs of the amplifier 222 produces an output signal from the amplifier 222 to the microprocessor 120. A test of the operability of the shunt circuit 110 may be provided by supplying a pulse train of square waves through the test path 222C from the microprocessor 120. The square waves have nearly infinite slope at the zero crossing and high enough magnitude to simulate a parallel arc fault.

Figure 2C:
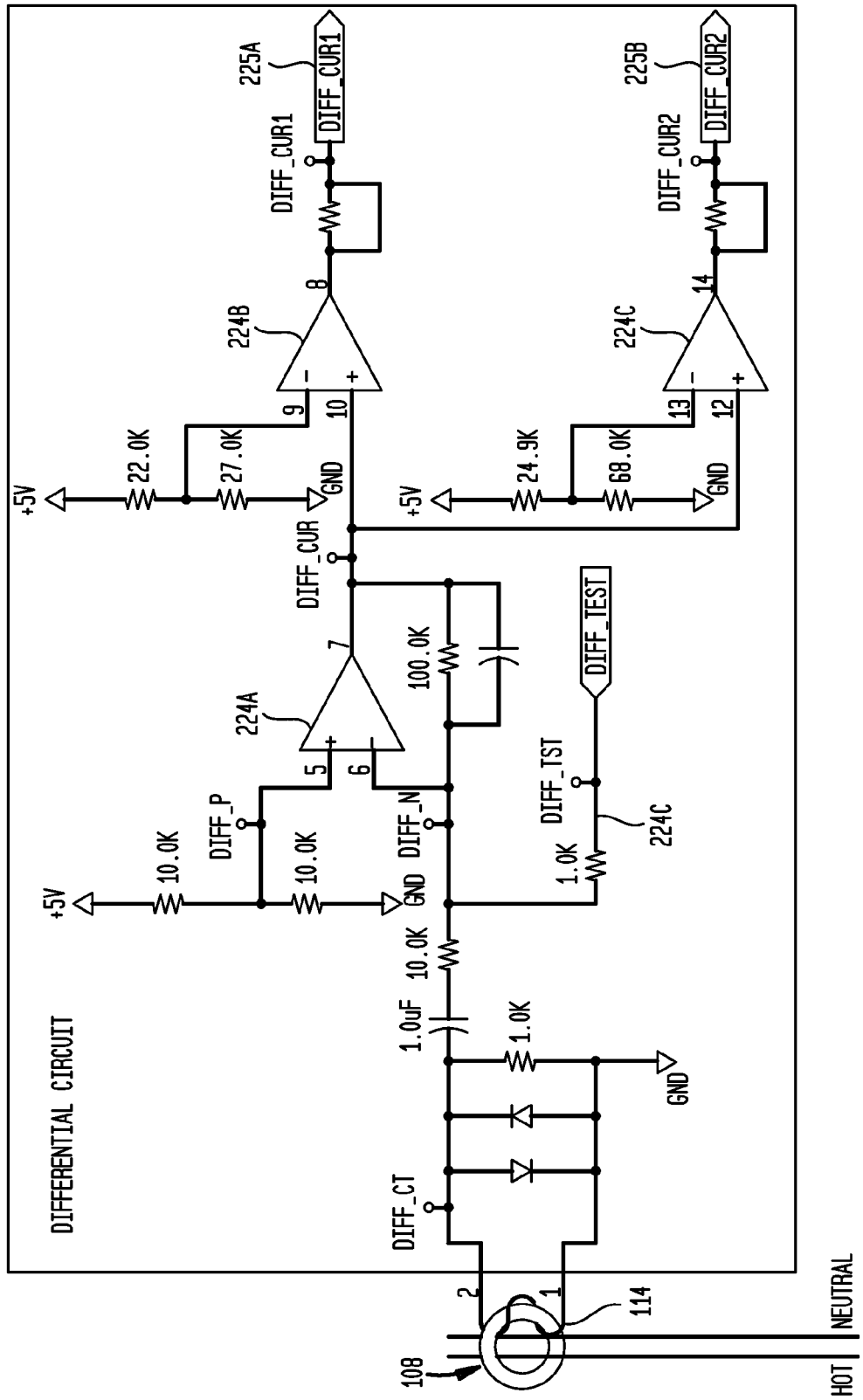
FIG. 2C illustrates an embodiment of exemplary differential circuit of an arc fault interruption apparatus according to an aspect of the present invention.

FIG. 2C illustrates the arc fault detection circuitry 102 may include a differential circuit 107 having one or more amplifiers 224A-224C that may be electrically connected to the sensor 108 (e.g., transformer), and in particular, to the coil 114 of the transformer by way of electrical conductors. Additional analog or digital filtering and/or conditioning components may be included in the differential circuit 107. The amplifiers 224B, 224C generate output digital signals at output nodes 225A, 225B to the microprocessor 120. The outputs at output nodes 225A, 225B is indicative of two different differential fault currents and is used to determine the differential fault current levels corresponding to 50 mA and 250 mA faults respectively, for example. Means for testing the operability of the differential circuit 107 may also be provided. For example, the test circuit may test the detection by providing an emulated arc fault signal in path 224C. The test circuit may include a switch 228, such as a push-to-test switch, or other type of switch, that may be used to activate the test circuit. The switch 228 (FIG. 2B) may be controlled either manually or automatically. In the depicted embodiment a push button 103A (FIG. 1) activates the switch 228. As the switch 228 is closed, a test signal is provided in paths 222C, 224C to detect if the detection circuitry is working correctly. If the detected outputs from the amplifiers 222, 224 are sufficient, then an arc counter may be incremented by a preset amount for each detected half cycle. After a predetermined number of half cycles, the arc counter threshold may be exceeded, and a trip signal may be sent, or a status indication that the circuit is performing acceptably may be provided or displayed.

In operation of the circuit breaker and fault interruption system 100, an output signal indicative of current flow in the shunt 111 is received by microprocessor 120. The current waveform is measured at a high sampling rate to determine the existence of zero crossings in the waveform and to determine the slope of the waveform at the zero crossing. The zero crossing slope may be determined at the leading or trailing edge of the half cycle of the waveform. The maximum (peak) amplitude of the rectified current waveform may also be determined for each half cycle. In accordance with a first aspect, a dynamic slope threshold is then set (dynamically) based upon the peak amplitude of the measured waveform for that half cycle.

The peak amplitude may be determined by any suitable means, such as a ample and compare routine wherein a previously-obtained sample is compared to a next obtained sample in time. As soon as the sample value decreases, the previously-obtained local maxima value is held for at least a fixed amount of time (e.g., 1 ms). This is to make sure that the new sample can be compared to discover the local maxima. After the lapse of this fixed time, the local maxima is declared as the peak amplitude magnitude (A) of the half cycle.

The dynamic slope threshold may be determined by the following expression:

$$\text{Slope Threshold} = A \times 2\pi \times 60 + \text{offset constant} \qquad \text{Equation 1}$$

where A is the peak amplitude of the half cycle.

This dynamic slope threshold is stored in memory and used for comparing the instantaneous slope at a zero crossing of a half cycle. The slope at the zero crossing of a half cycle may be determined at the leading edge of the next half cycle. For example, the slope at the zero crossing may be determined by curve fitting the signal output at 224 and estimating the slope at the zero crossing based upon the curve fit. For example, the slope may be estimated by calculating a first derivative of the curve fit equation of the current waveform. Other slope approximation techniques may be used. For example, the slope at the zero crossing may be determined by passing the input signal through a common filter. For example, a common filter such as following may be used.

$$\text{slope} = A^*(X_3 - X_0) + B^*(X_2 - X_1)$$

where $X_n$ is the nth input sample, and n=3 is the latest input sample. The constants A and B can be determined by different methods. For example the values of A can be 1 and B can be 2.

Once determined, if the slope at the zero crossing is above a dynamic slope threshold, then this may be indicative of an interruption event (e.g., parallel arc fault occurring). If the half cycle peak amplitude is also above a preset peak threshold, then an arc counter may be incremented so that eventually a trigger signal may be sent to node 230 of the trip circuit shown in FIG. 2D. For example, the arc counter may be incremented for each half cycle where both detection criteria are met. Once the arc count threshold is exceeded, a trigger signal is sent to the trip circuit 105. The trigger signal causes the solenoid actuator 105A to open the switch 116 and therefore interrupt power to the one or more loads 106 of the electrical distribution circuit.

Several optional possibilities will now be explained in more detail. In another aspect, if an upper amplitude threshold (e.g., 200 mA) is exceeded, but the dynamic slope threshold is not exceeded, then an arcing event is not indicated and the counter is not incremented. If the dynamic slope threshold is exceeded, but a lower amplitude threshold (e.g., 30 mA) is not exceeded, likewise then the arc counter is not incremented, as an arcing event is not indicated. However, if the dynamic slope threshold is exceeded, and a half cycle peak amplitude is above a lower amplitude threshold and below an upper amplitude threshold, then the arc counter is incremented, as this is indicative of an arcing event. If the dynamic slope threshold is exceeded, and a half cycle peak amplitude is above an upper amplitude threshold, then an immediate tripping signal may be sent, as this is indicative of an arcing event.

Figure 2D:
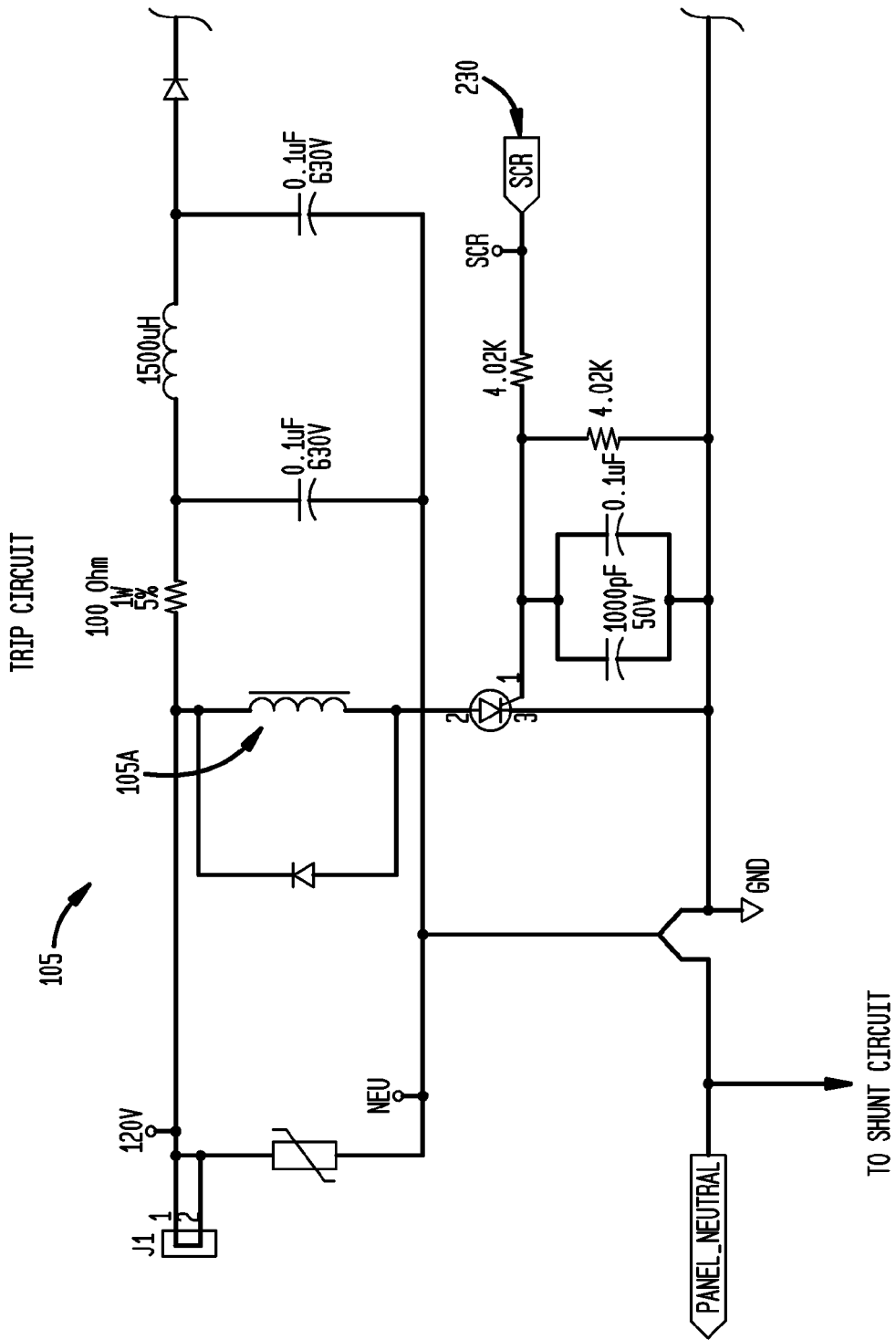
FIG. 2D illustrates an embodiment of exemplary trip circuit of an arc fault interruption apparatus according to an aspect of the present invention.
Figure 2E:
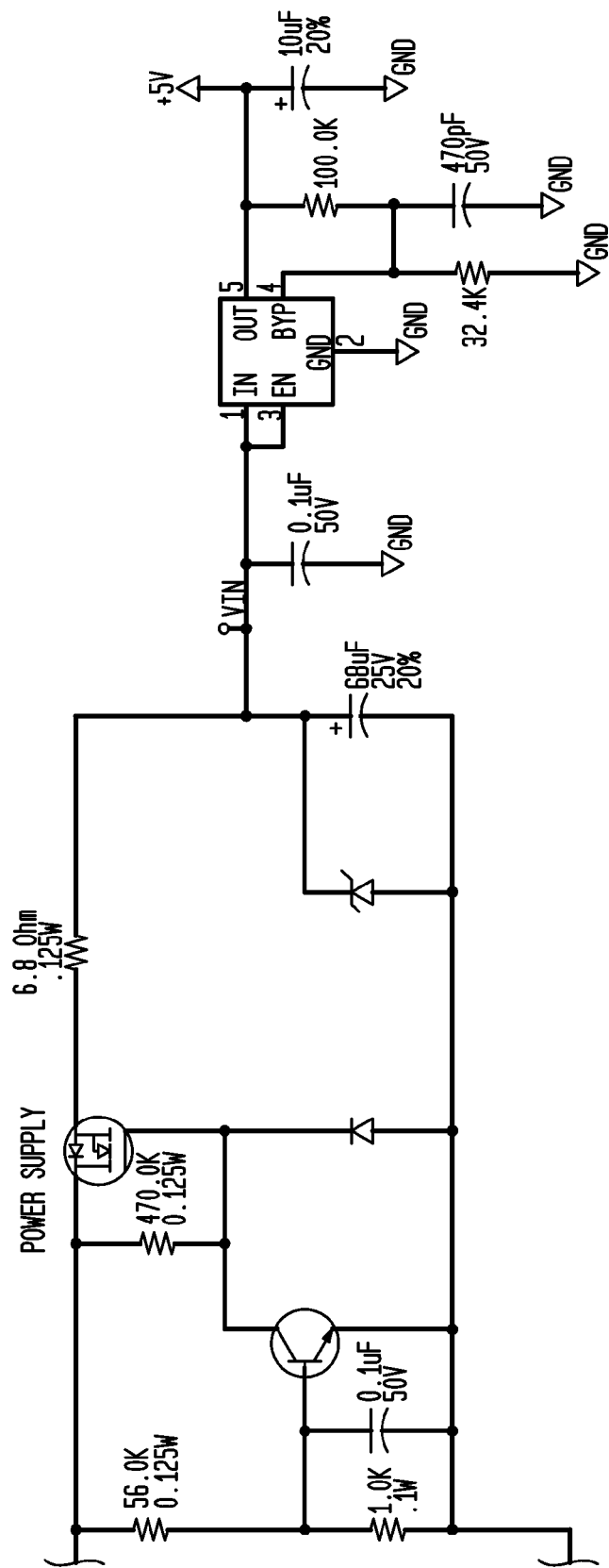
FIG. 2E illustrates an embodiment of exemplary power supply circuit of an arc fault interruption apparatus according to an aspect of the present invention.

In accordance with another aspect, in a first instance, the arc counter is incremented when the amplitude and slope tripping criteria are met if there is no decay in the half cycle magnitude present for greater than a predetermined number of half cycles. For example, if there are three half cycles where no appreciable decay in the half cycle amplitude of the measured waveform, then on the fourth half cycle meeting both triggering criteria, a trip signal may be sent to the trip circuit 105 at 230 (See FIG. 2D). For example, each half cycle where the tripping criteria is met may increment an arc counter by one increment, wherein four increments may cause a trip signal to be sent to the trip circuit 105 (FIG. 2D). Thereafter, the counter may be reset (e.g., to zero). More or less number of cycles may be used to cause the trip signal to be sent.

However, in a second instance, if it is noted that the amplitude signal is decaying at a magnitude greater than a preset decay threshold over greater than a predetermined number of half cycles (e.g., three half cycles), then the arc counter may not be incremented, and may be zeroed. For example, after a predetermined number of consecutive half cycles (e.g., three consecutive half cycles) wherein a decay from the previous cycle over a decay threshold is indicated, the incrementing of the arc counter may be stopped. If a fourth sequentially-decaying half cycle is detected, the arc counter may be cleared (set to zero). Also, after a fourth decaying half-cycle is detected, the arc counter may be prevented from incrementing for a pre-set amount of time. Accordingly, generating a trip signal on conditions (such as an in rush condition) that may exhibit signal attributes that would, but for the decay, otherwise trip the circuit breaker may be avoided. The decay threshold may be set based upon one or more experimental determinations. In the depicted embodiment, a digital arc fault counter in memory 120A may be incremented by an integer or multiple integers depending upon the peak amplitude magnitude and zero crossing slope measured for each half cycle. When a preset arc count threshold is met, a trip signal (e.g., a digital signal) may be provided to a driver at node 230 to cause a coil of a trip actuator 105A (e.g., a solenoid) to actuate the switch 116 to be opened via mechanical connection 118. This causes an interruption in the power to the load 106 by opening the hot line 115. In some instances, the current may be above an upper peak threshold (200 mA) and the current slope at the zero crossing may exceed the dynamic slope threshold. In these instances, the counter may not be incremented at all and a trip signal; sent, or a greater number of integer increments (e.g., 2, 3, or 4) may be provided, but in any event, a trip signal may be sent directly and immediately to the trip circuit 105 so that the breaker is tripped in an minimum number of half cycles (e.g.; less than 2 half cycles).

In other embodiments, an arc fault counter may be accomplished by providing a suitable charge to an analog circuit containing a capacitor. Upon reaching a predetermined charge magnitude (analogous to the counter threshold), a trip signal may be provided to a trip actuator 105A to open the switch 116.

Figure 3A:
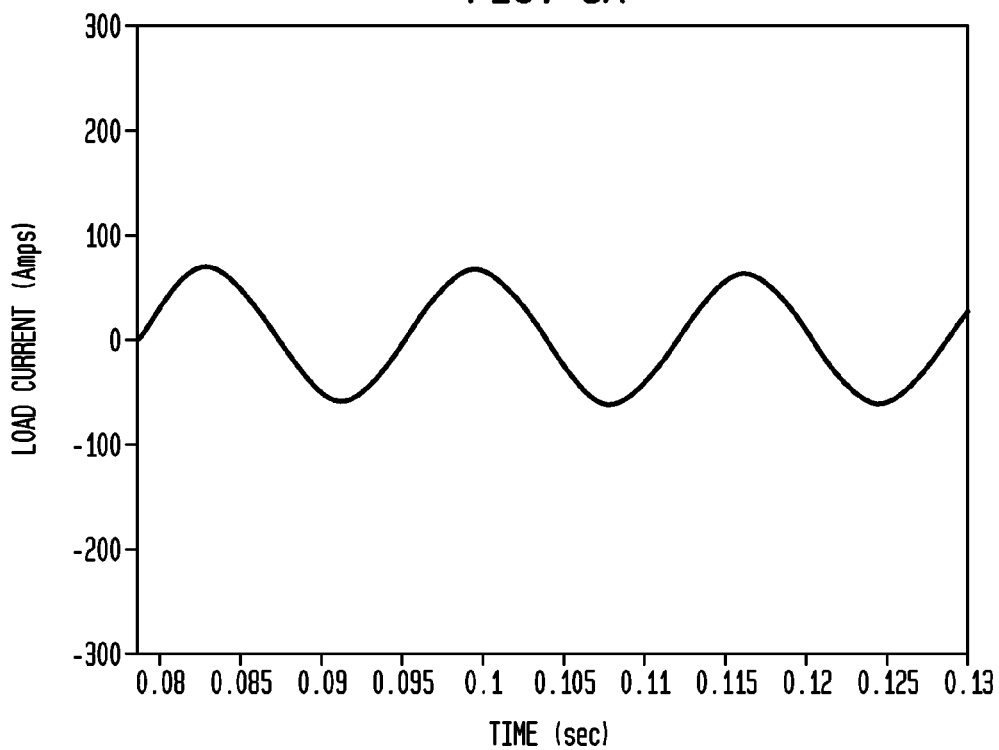
FIG. 3A illustrates a normal sinusoidal current waveform trace.
Figure 3B:
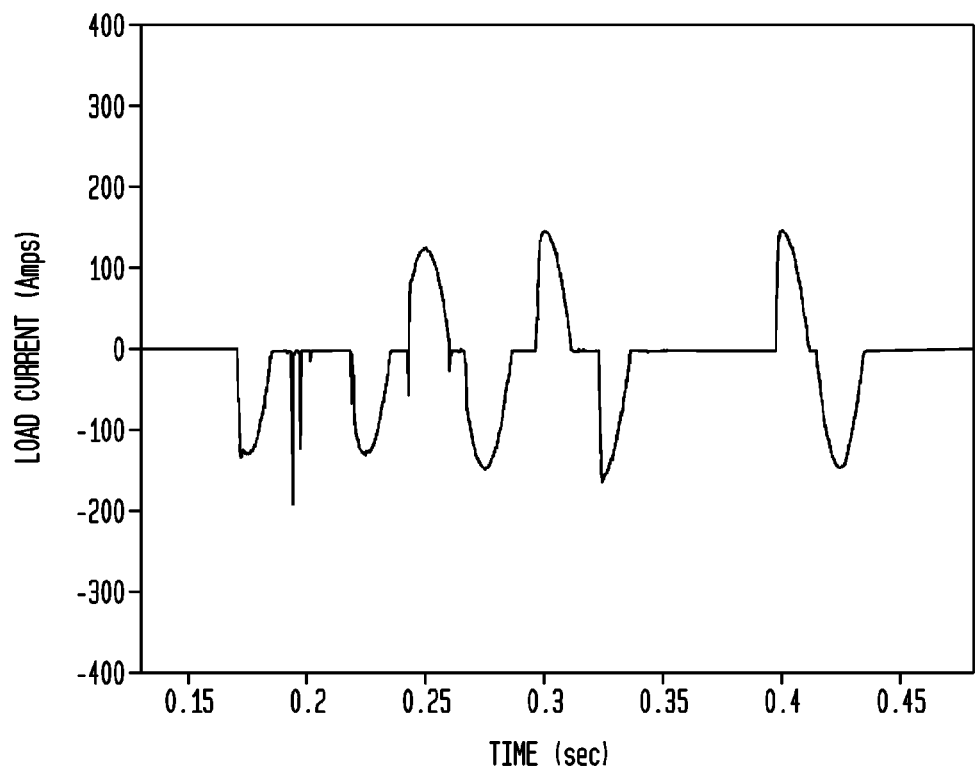
FIGS. 3B and 3C illustrate current waveform traces indicative of parallel arc faults that may be monitored by the method and apparatus of the invention.
Figure 3C:
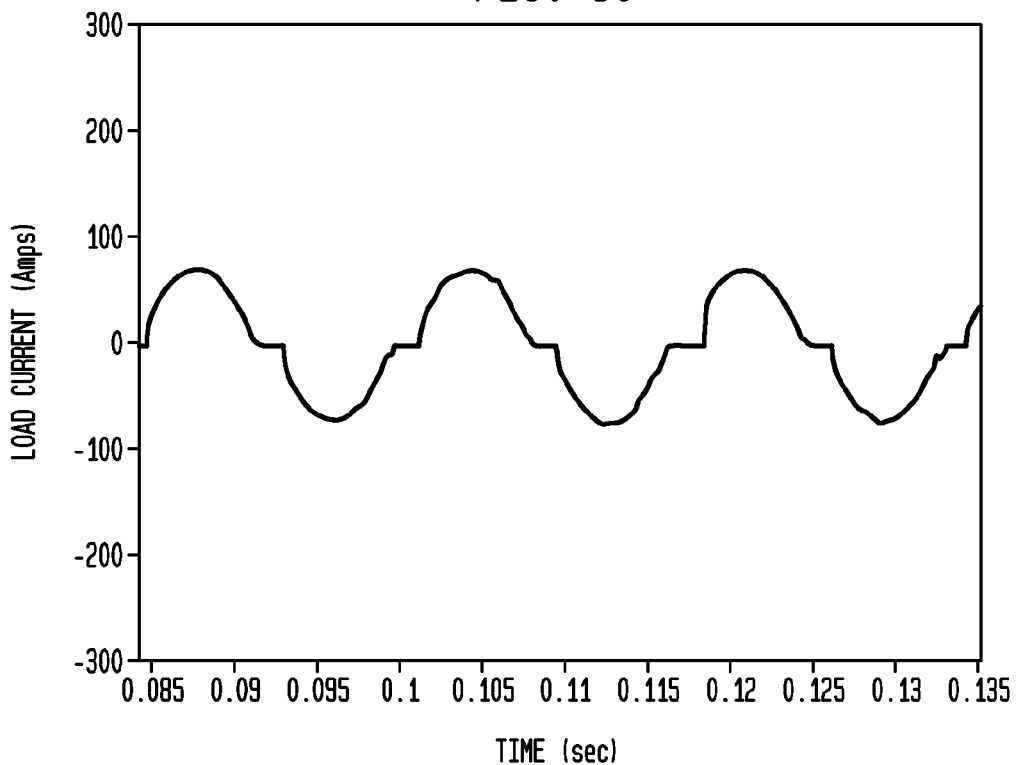
Figure 3D:
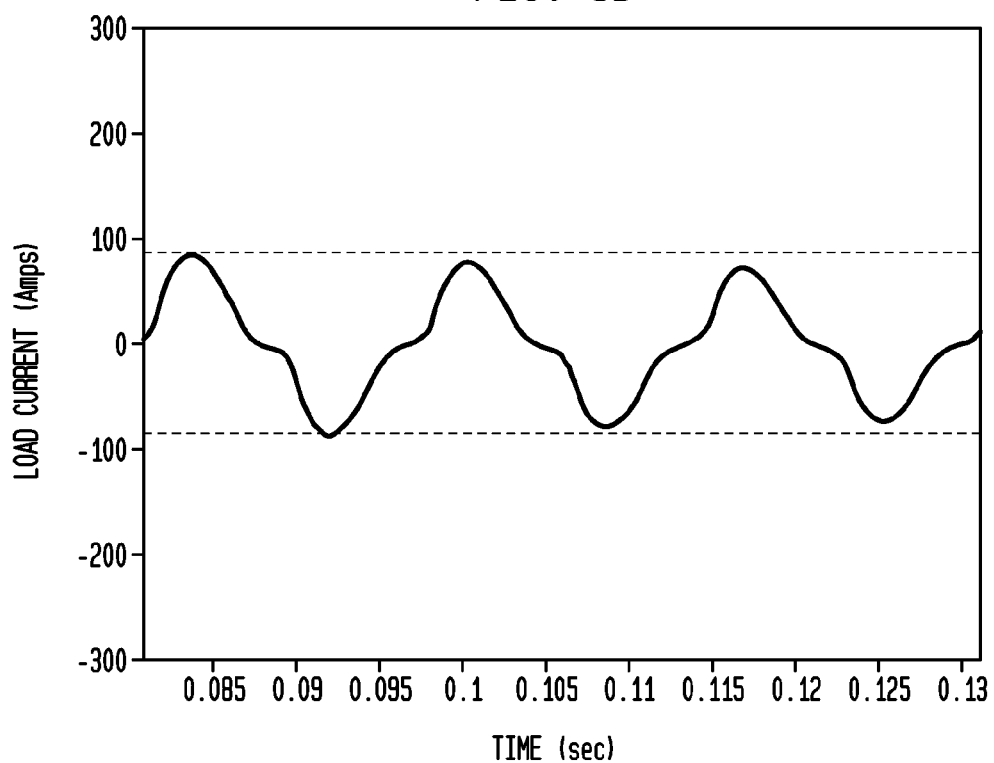
FIG. 3D illustrates a current waveform trace indicative of an in rush condition that may be monitored, but ignored, according to another aspect of the invention.

Following the sending of the trip signal the arc fault counter may be zeroed out, such as by resetting the electrical fault interrupting apparatus 100. In normal operation, i.e., with no parallel fault present, a representative signal trace output from the shunt circuit 110 is shown in FIG. 3A. FIGS. 3B and 3C illustrate representative signal trace outputs from the shunt circuit 110 that are indicative of a parallel arc fault event, i.e., an interruption event. FIG. 3D illustrates a typical in rush condition mimicking an arc fault event.

According to embodiments, in operation, the software routine operative in the microprocessor 120 continuously monitors the digital signal outputs at 224 from the shunt circuit 110 and at 225A, 225B of the differential circuit 107 to determine the existence of a parallel arc fault and/or a hot to ground fault, respectively. For example, the signal traces may be sampled at a relatively high average sample rate. Sampling rates of between about 7,500 and 11,000 samples/sec may be used. In some embodiments, a sampling rate of about 9,600 samples/sec may be used. For each rectified half cycle, a peak magnitude of the current waveform from the shunt 110 is monitored and stored in memory 220A. Likewise, for each rectified half cycle, a slope magnitude at the zero crossing is determined and stored in memory (either at the leading or trailing edge). These stored values are then processed according to a routine to determine if a parallel fault has occurred. For example, processing logic in the microprocessor 120 may subsequently determine when the magnitude of the stored peak amplitude magnitude of the rectified half cycle is below a lower peak threshold level, above an upper peak threshold level, or between the upper peak threshold level and the lower peak threshold level. Additionally, the processing logic in the microprocessor 120 may subsequently determine a dynamic slope threshold based upon the peak magnitude amplitude of the half cycle as discussed above, and determine if the instantaneous slope at the zero crossing of the current half cycle or the next half cycle is above the dynamic slope threshold. In some embodiments, the magnitude of the existing half cycle peak magnitude and the leading edge of the zero crossing of the next half cycle is measured against the thresholds. For example, the processing logic of the microprocessor 120 may be configured to calculate the first derivative of the output signal 224 derived from the shunt circuit 110 for each half cycle at the appropriate zero crossing. Processing logic may then determine whether, for a particular half-cycle under analysis, the slope associated with the derivative of the signal exceeds the dynamic slope threshold level that is indicative of a parallel arc-fault condition. Likewise, the processing logic may determine whether, for a particular half-cycle under analysis, the peak magnitude of the signal exceeds the amplitude peak threshold level that is indicative of a parallel arc-fault condition.

In practice, the arc fault interruption system 100 of the invention may be configured to detect arcs associated with line-neutral that may be typically short enough in duration so as not to trip a conventional circuit breaker. The arc fault interruption system 100 may be adapted to detect such parallel arc faults and trip within a few half-cycles of detecting the condition.

In the arc fault interruption system 100, AC current conditioning and full-wave rectification may be provided by the shunt circuit 110 having an amplifier 222 configured to prepare the AC current from the electrical shunt 111 (See FIG. 2A) for half-wave analysis by the microprocessor 120. The microprocessor 120 (see FIG. 2B) processes the inputs from the shunt circuit 110 at node 224 and from the differential circuit (FIG. 2C) at nodes 225A, 225B.

The arc fault interruption system 100 may also include a differential circuit adapted to determine differential faults greater than 50 mA. The differential circuit 107 provides the microprocessor 120 with two PWM signals. Both the PWM signals correspond to the input signal greater than fixed thresholds determined for 50 mA and 250 mA current, respectively. Once the PWM signal is received by the microprocessor 107, the pulse width of the signal is calculated and stored. For example, if the width of the PWM signal is greater than 3 ms and less than 9 ms for the 50 mA comparator a differential fault event counter is incremented. If the fault event counter is greater than a pre-determined threshold, the processor 107 sends a trip signal to the trip circuit 105.

The arc fault interruption system 100 may include a grounded neutral transmitter sensor 108. This sensor 108 may be toroid-type current sensing device that monitors both line (Hot) and Neutral conductors. A grounded neutral fault condition forms a magnetic path that passes thru the grounded neutral toroid. This allows the grounded neutral toroid to induce an oscillatory wave on both the line and neutral conductor. However, induced current can only flow in the neutral wire due to the grounded neutral fault path. The current imbalance between the line and neutral wires is sensed by the differential ground fault toroid. In response to this current imbalance provided at the outputs nodes 225A, 225B of the differential circuit 107 (See FIG. 2C), a ground fault trip signal may be generated by the microprocessor 120 and provided to the trip circuit 105 at node 230 (e.g., SCR driver). An exemplary embodiment of the differential circuit 107 of the fault detection system 100 is illustrated in FIG. 2D.

Detection circuitry may be adapted to monitor the net current between a primary line and a neutral line, and compare the net current with the AC load current signal. If the comparison indicates that the difference between the net line-to-neutral current is inconsistent with a load current by a predetermined acceptable amount (which may be indicative of current leakage in the distribution system), a differential fault may be detected and a trip signal may be generated. Those skilled in the art will recognize that ground fault detected system and differential fault detection system may be combined in a single unit. Alternatively, in certain situations where ground fault protection is not required or desired by a user, ground fault protection system may be disconnected or disabled (e.g., via a selector switch (not shown)).

Microprocessor 120 may include one or more memory devices for storing information associated with device 100. Memory devices may include any type of memory device suitable for the storage of data associated with operations of apparatus 100. For example, microprocessor 120 may include one or more data registers for storing data indicative of the status of apparatus 100. According to one embodiment, microprocessor 120 may be adapted to store fault-related information instantaneously, in the event of a detected fault. Because microprocessor 120 may store status information in a manner of microseconds during the time required for an actuator associated with device 100 to interrupt the circuit (typically milliseconds), those skilled in the art will recognize that microprocessor 120 can store the status information at the time of the trip, without unnecessarily delaying a trip condition to store the information.

Figure 4:
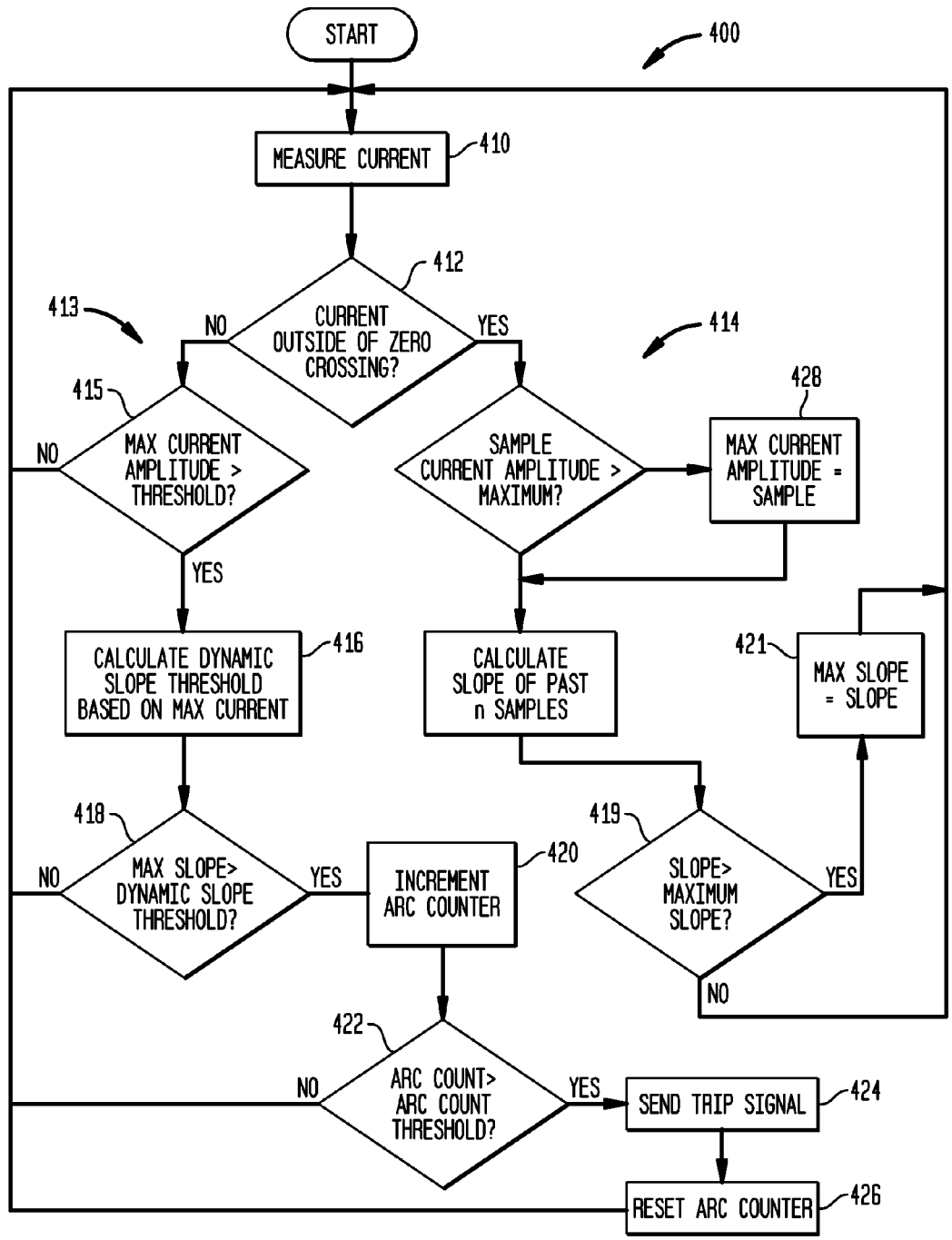
FIG. 4 illustrates a flowchart depicting an exemplary method according to another aspect of the invention.

FIG. 4 provides a flowchart illustrating a first exemplary embodiment of a method 400 of electrical arc fault detection associated with the arc fault interruption system 100 in accordance with an aspect of the invention. As illustrated in FIG. 4, the shunt circuit 110 of the system 100 may measure current flow through the shunt 111 (FIG. 1) and provide a rectified current signal in 410. In decision block 412, it may be determined whether the current waveform is at a point in time in the signal trace that is outside of the zero crossing area. The zero crossing area may be determined by comparing the full wave rectified input signal to a certain percentage of the peak amplitude value of the previous half cycle. Typically, a signal lower than 5% of the peak amplitude can be considered to be in the zero crossing area.

If the current is not outside of the zero crossing in 412, i.e., it is at the zero crossing, then the left path 413 of the flowchart is followed. In this path 413, the maximum peak amplitude of the half cycle (obtained from the right path 413) is compared against a preset peak amplitude threshold in 415. If the peak amplitude threshold is not (N) exceeded in 415, then the routine loops back to the beginning. If the peak amplitude threshold is exceeded (Y) in 415, then the dynamic slope threshold is calculated in 416. The dynamic slope threshold may be determined and based upon the peak amplitude (e.g., of the half cycle) as described in the equation above. The current slope at a zero crossing of the first or next half cycle is determined in the right path 414 by blocks 419 and 421 by setting the maximum slope to the current slope.

If the maximum slope at the zero crossing is greater (Y) than the dynamic slope threshold in 418, then a counter may be incremented in 420, provided the amplitude threshold is also exceeded. However, if the maximum current slope at the zero crossing is less (N) than the dynamic slope threshold in 418, then the routine loops back to the beginning, and continues to monitor the instantaneous current of the waveform. When the arc count becomes greater (Y) than the preset arc count threshold in 422, then a trip signal may be sent in 424. The trip signal may be sent by microprocessor 120 to the trip circuit 105 at node 230 (FIG. 20). The arc counter may be incremented any predetermined number of increments for each half cycle where both the peak amplitude threshold and the dynamic slope threshold are exceeded. For example, the arc counter may be incremented by one integer for each half cycle when both dynamic slope threshold and the amplitude threshold are exceeded. If both are exceeded for a predetermined number of cycles (e.g., 4 cycles), then a trip signal may be sent in 424. This ensures that a trip signal is sent in 424 within about four half cycles of encountering and detecting the arc fault event. Upon sending the trip signal, the arc counter may be reset to a predetermined value (e.g., zero) in 426. After the arc counter is reset in 426, the routine may loop back to the beginning wherein the routine continues to continuously monitor the current waveform in the shunt 111.

If the current is outside of the zero crossing, then the right path 414 is followed. This path determines if the instantaneous measured current is the maximum (peak) current for the particular half cycle. Once it is determined in 412 that the current is not outside of the zero crossing, the maximum current amplitude of the half cycle of the detected current waveform determined in 428 is used in 415 and measured against the preset amplitude threshold. Any suitable peak holding or determining method may be used for determining the peak amplitude and the maximum slope at the zero crossing.

In actual practice, the zero crossing may be a small region surrounding the zero crossing of the existing half cycle (or the next half cycle) of the current waveform. The slope may be determined at a location at or near the beginning (trailing edge of existing half cycle) or end (leading edge of next half cycle) of the zero crossing region. For example, in some embodiments, the region may encompass a time zone spanning less than about 3 ms around zero crossing.

Figure 5A:
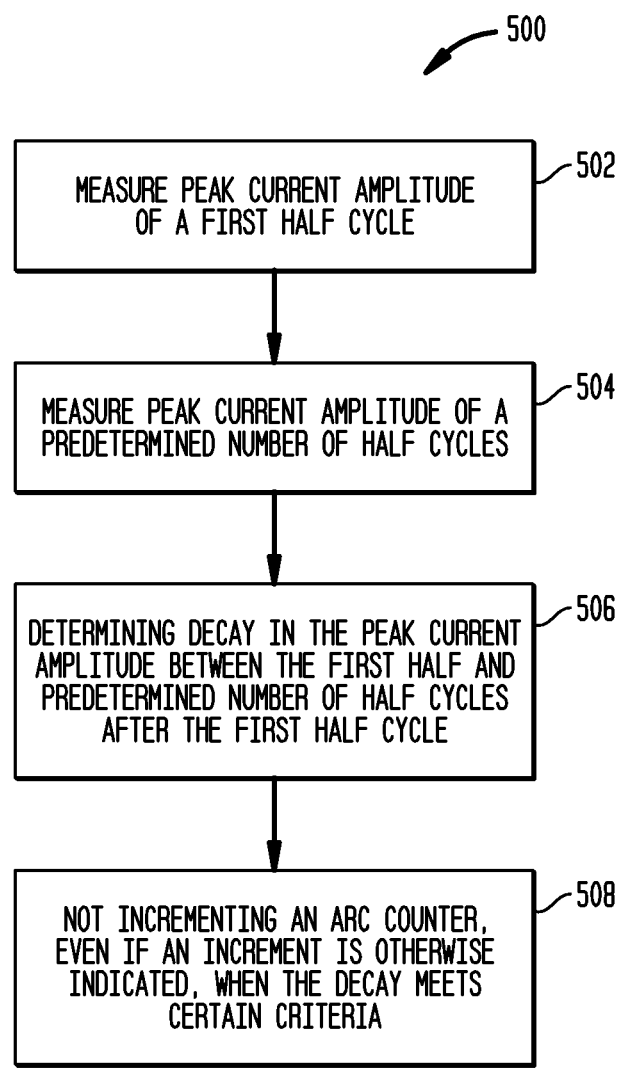
FIGS. 5A and 5B illustrate flowcharts depicting exemplary methods according to another aspect of the invention.
Figure 5B:
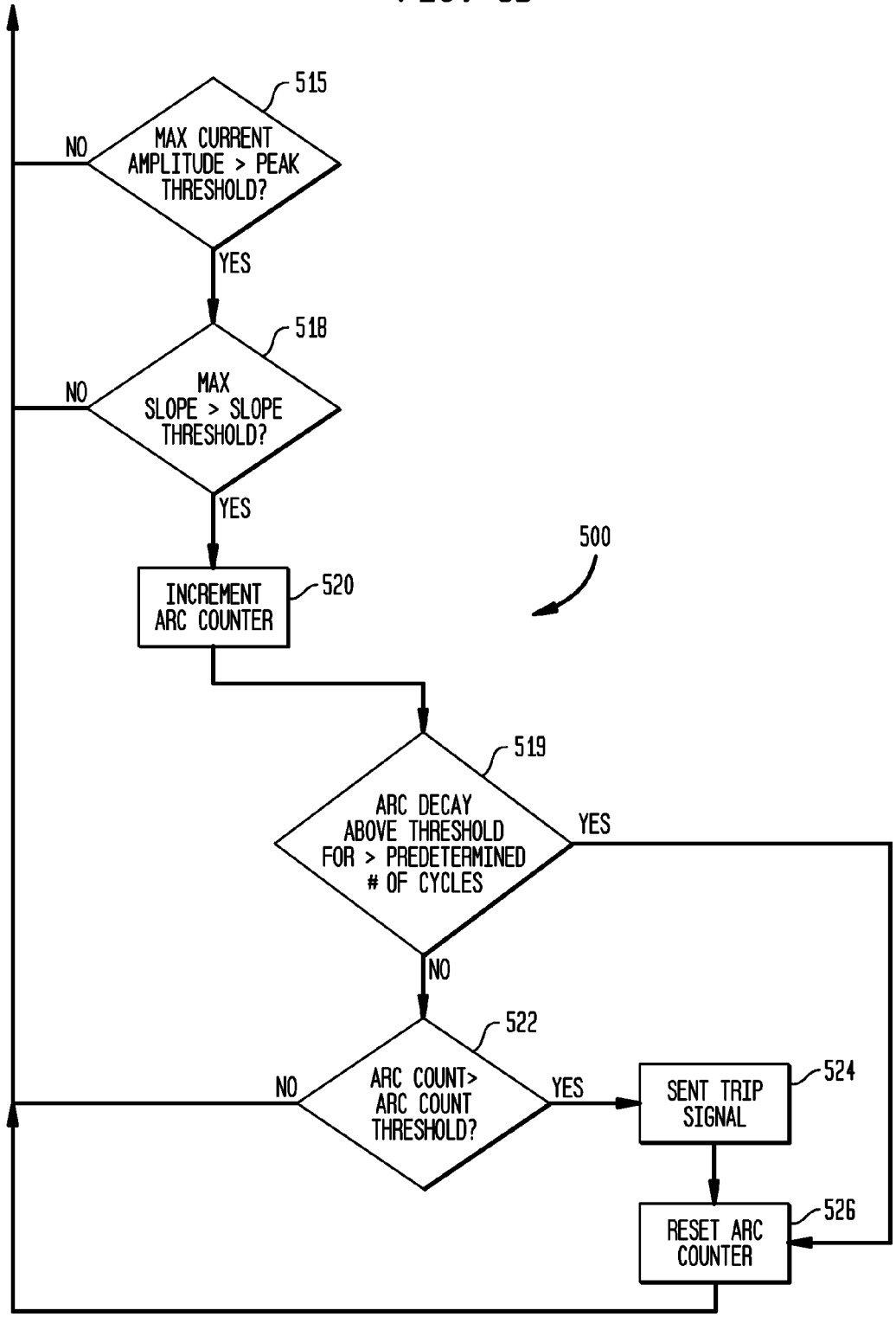

In accordance with another aspect of the invention as shown in FIGS. 5A and 5B, a method of electrical arc fault detection is provided. The method 500 includes measuring a first current peak amplitude of a first half cycle of a detected current waveform in 502, measuring a current peak amplitude of the detected current waveform for a predetermined number of consecutive half cycles after the first half cycle in 504; determining an amplitude decay based on the first and predetermined number of subsequent consecutive current peak amplitudes; and not incrementing an arc counter, even if an increment is otherwise indicated, when the decay of the amplitude meets certain decay criteria. For example, if the decay is greater than a predetermined decay threshold for greater than a predetermined number of half cycles, then an arc counter is not further incremented. For example, the counter may be incremented for three cycles where a flag is set to count the number of consecutive cycles meeting the decay threshold. If a fourth cycle also meets the trip criteria and decay criteria, then the arc counter may be zeroed. This aspect may be used with the aspect of invention comparing the zero crossing slope to a dynamic slope threshold also described herein.

For example, as shown in FIG. 5B, after the peak current amplitude is measured, the measured peak of the half cycle is checked against an amplitude threshold in 515. If the maximum current amplitude is greater than the predetermined peak threshold (Y), then the measured maximum slope at the zero crossing is compared to a slope threshold in 518. If the slope at the zero crossing is greater than the slope threshold (Y), then the current waveform is indicates a possible tripping condition and an arc counter is incremented in 520. If both are met, then the routine will check the arc decay is above the arc decay threshold for greater than the predetermined number of cycles in 519. If the decay is greater than a decay threshold for greater than the predetermined number of cycles (Y), the routine will reset the counter in 526. If (N), then the routine determines if the arc count is greater than an arc count threshold in 522, and, if (Y), a trip signal may be sent in 524. After this, the arc counter may be reset (e.g., to zero) in 526. If (N), the routine loops back and continues to monitor the current waveform. The remainder of the routine not shown is the same as shown and described with reference to FIG. 4. Thus, the routine will continue to monitor the current waveform flowing in the shunt 111 and will increment the arc counter if the trip criteria is met and the decay is either above or below the decay threshold for a predetermined number of half cycles. If on the next consecutive half cycle, a consecutive decay is detected and the tripping criteria is met, the counter may be reset to zero. Accordingly, tripping on decaying half cycles that otherwise meet the trip criteria may be avoided.

In some embodiments, the arc counter may be decremented or reset based upon the amplitude and slope being below the designated thresholds for a predetermined number of half cycles. For example, if an arc fault is otherwise indicated for three half cycles, and then a predefined number of cycles elapse with no further fault indications, then the arc fault counter may be decremented or reset (e.g., to zero). For example, the value of the fault counter may be set to zero upon the $10^{th}$ half cycle (or other half cycle) wherein both the magnitude and slope thresholds are not exceeded. If the magnitude of the current signal only crosses the amplitude peak threshold levels twice, substantially less than the ten zero crossings required to reset the fault count value may be utilized. In some embodiments, the microcontroller 120 is operable to increase the dynamic slope threshold where a measured maximum amplitude of a first half cycle peak as compared to measured maximum amplitude of at least one later half cycle peak does not indicate a amplitude decay. The dynamic slope threshold may be increased by approximately 20%, for example. Other amounts of increase may be used.

In some instances, the arc fault counter may be incremented on the values of the peak threshold and slope threshold being exceeded in the first half cycle. However, if in the second half-cycle, if both the peak amplitude and maximum slope at the zero crossing are less than the thresholds, then the routine may reset the arc fault counter (e.g., to zero). In other embodiments, the arc fault counter may be decremented if the second half cycle does not indicate a fault condition wherein both the peak amplitude and slope at the zero crossing are less than the thresholds. In optional embodiment, two or more additional normal half cycles may be required to reset or decrement the arc fault counter.

Microprocessor 120 may perform a self test by polling one or more of the circuits coupled to the processor 120. According to one exemplary embodiment, this self test may be initiated automatically by processor 120 to periodically verify the appropriate operation of the detection circuitry 102. Alternatively, this check may be initiated by a test request provided by the user (e.g., by pressing a "push-to-test" button associated with the system 100). During the test, the microprocessor 120 may test any of the systems components, test the software routine, perform RAM checks to ensure appropriate operation of a RAM module, CRC, or checksum routines to detect errors in the transmission and storage of data associated with processor 120, and/or execute watchdog timers to detect sequencing errors associated with processor 120. Processor 120 may compare test data with predetermined operational specifications for each device or circuit and determine if the device or circuit is operating within acceptable tolerances.

It should be readily appreciated by those persons skilled in the art that the present invention is susceptible of broad utility and application. Many embodiments and adaptations of the present invention other than those herein described, as well as many variations, modifications, and equivalent arrangements, will be apparent from or reasonably suggested by the present invention and the foregoing description thereof, without departing from the substance or scope of the present invention. Accordingly, while the present invention has been described herein in detail in relation to specific embodiments, it is to be understood that this disclosure is only illustrative and exemplary of the present invention and is made merely for purposes of providing a full and enabling disclosure of the invention. This disclosure is not intended to limit the invention to the particular apparatus or methods disclosed, but, to the contrary, the intention is to cover all modifications, equivalents, and alternatives falling within the spirit and scope of the invention.

What is claimed is:

1. A method of electrical arc fault detection, comprising:
   measuring a maximum current amplitude of a first half cycle of a detected current waveform;
   detecting a current slope at a zero arc crossing of the first half cycle or a next half cycle;
   comparing the maximum current amplitude to an amplitude threshold; and
   comparing the current slope to a dynamic slope threshold.

2. The method of claim 1, comprising calculating the dynamic slope threshold based on the maximum current amplitude of the first half cycle of the detected current waveform.

3. The method of claim 1, wherein the dynamic slope threshold varies as a function of measured current amplitude of the first half cycle.

4. The method of claim 1, wherein the maximum current amplitude of the first half cycle is checked for decay against a maximum current amplitude of a predetermined number of half cycles after the first half cycle.

5. The method of claim 1, comprising incrementing an arc count value of an arc counter based upon the amplitude threshold and the dynamic slope threshold both being exceeded.

6. The method of claim 5, comprising generating a trigger signal based upon the arc count value exceeding an arc count threshold.

7. The method of claim 1, comprising calculating the dynamic slope threshold by determining a maximum amplitude of a measured current amplitude of the half cycle of the detected current waveform.

8. The method of claim 1, comprising:
   measuring a maximum current amplitude of a second half cycle of the detected current waveform after the first half cycle, and
   comparing the maximum current amplitudes of the first and second half cycles to determine a decay.

9. The method of claim 8, comprising:
   measuring a current amplitude of the detected current waveform for a predetermined number of half cycles after the first half cycle;
   comparing the current amplitudes to determine a decay; and
   not incrementing an arc counter, even if a increment is otherwise indicated, when the decay is greater than a threshold decay for greater than a predetermined number of half cycles.

10. The method of claim 8, comprising:
    generating a trip signal if an arc count value of an arc counter exceeds an arc count threshold.

11. The method of claim 8, comprising increasing the dynamic slope threshold when a measured maximum amplitude of a first half cycle peak when compared to measured maximum amplitude of at least one later half cycle peak does not indicate a decay.

12. A method of electrical arc fault detection, comprising:
    measuring a first current amplitude of a first half cycle of a detected current waveform;
    measuring a current amplitude of the detected current waveform for a predetermined number of half cycles after the first half cycle;
    comparing the current amplitudes to determine a decay; and
    not incrementing an arc counter, even if a increment is otherwise indicated, when the decay is greater than a threshold decay for greater than a predetermined number of half cycles.

13. An electrical fault interrupting apparatus, comprising:
    an electrical shunt coupled to a load neutral;
    a shunt circuit coupled to the electrical shunt; and
    a microprocessor coupled to the shunt circuit, the shunt circuit adapted to generate and provide a current waveform to the microcontroller, the microprocessor adapted to calculate a dynamic slope threshold based upon a current amplitude of a half cycle of the waveform, and compare an instantaneous current slope obtained from the waveform at a zero crossing to the dynamic slope threshold.

14. The electrical fault interrupting apparatus of claim 13, wherein the microcontroller is adapted to increment an arc counter when a sensed current magnitude exceeds a threshold magnitude and a sensed current slope exceeds the dynamic slope threshold, the arc counter generating a trip signal when an arc counter threshold is exceeded, the trip signal adapted to cause a trip actuator to open a hot line.

15. The electrical fault interrupting apparatus of claim 13, wherein the microcontroller is operable to compare a measured slope at a zero crossing of a half cycle of a current waveform measured by the shunt circuit against the dynamic slope threshold.

16. The electrical fault interrupting apparatus of claim 13, wherein the microcontroller is operable to compare:
    a measured maximum amplitude of a half cycle of a current waveform through the shunt to an amplitude threshold; and
    a current slope at a zero crossing of the half cycle of the current waveform measured by the shunt circuit against a dynamic slope threshold.

17. The electrical fault interrupting apparatus of claim 13, wherein the microcontroller is operable to compare a measured maximum amplitude of a peak of a first half cycle to a measured maximum amplitude of a peak at least one later half cycle peak to determine an extent of amplitude decay.

18. The electrical fault interrupting apparatus of claim 13, wherein the microcontroller is operable to increase the dynamic slope threshold where a measured maximum amplitude of a first half cycle peak as compared to measured maximum amplitude of at least one later half cycle peak does not indicate a amplitude decay.

19. An electrically protected system, comprising:
an electrical fault interrupting apparatus having
   an electrical shunt coupled to a load neutral;
   a shunt circuit coupled to the electrical shunt; and
   a microprocessor coupled to the shunt circuit, the shunt circuit adapted to generate an current amplitude signal to the microcontroller, the microprocessor adapted to calculate a dynamic slope threshold based upon the current amplitude signal, and compare an instantaneous current signal at a zero crossing from the shunt circuit to the dynamic slope threshold; and
a load coupled to the electrical fault interrupting apparatus.

20. The electrical fault interrupting apparatus of claim 19, wherein the microprocessor is adapted to measure a first current amplitude of a first half cycle of a detected current waveform, measure a current amplitude of the detected current waveform for a predetermined number of consecutive half cycles after the first half cycle, compare the current amplitudes to determine a decay, and not increment an arc counter, even if a counter increment is otherwise indicated, when the decay is greater than a decay threshold for greater than a predetermined number of half cycles.

\* \* \* \* \*